(12) United States Patent
Kim et al.

(10) Patent No.: US 8,603,867 B2
(45) Date of Patent: Dec. 10, 2013

(54) COMPOSITION FOR REMOVING A PHOTORESIST AND METHOD OF MANUFACTURING A THIN-FILM TRANSISTOR SUBSTRATE USING THE COMPOSITION

(75) Inventors: Bong-Kyun Kim, Hwaseong-si (KR); Shin-Il Choi, Hwaseong-si (KR); Hong-Sick Park, Suwon-si (KR); Wang-Woo Lee, Suwon-si (KR); Seok-Jun Jang, Asan-si (KR); Byung-Uk Kim, Hwaseong-si (KR); Sun-Joo Park, Pyeongtaek-si (KR); Suk-Il Yoon, Suwon-si (KR); Jong-Hyun Jeong, Seoul (KR); Soon-Beom Hur, Anyang-si (KR)

(73) Assignee: Samsung Display Co., Ltd. (KR)

( * ) Notice: Subject to any disclaimer, the term of this patent is extended or adjusted under 35 U.S.C. 154(b) by 76 days.

(21) Appl. No.: 13/439,418

(22) Filed: Apr. 4, 2012

(65) Prior Publication Data

US 2013/0017636 A1    Jan. 17, 2013

(30) Foreign Application Priority Data

Jul. 14, 2011    (KR) ........................ 10-2011-0070014

(51) Int. Cl.
*H01L 21/312*    (2006.01)

(52) U.S. Cl.
USPC .... 438/149; 510/212; 252/79.1; 257/E21.242

(58) Field of Classification Search
USPC .......................... 438/149; 510/212; 252/79.1; 257/E21.242
See application file for complete search history.

(56) References Cited

U.S. PATENT DOCUMENTS

| 6,869,921 B2 * | 3/2005 | Koito et al. ................... 510/176 |
| 2002/0134963 A1 * | 9/2002 | Peyne et al. ................... 252/79.1 |
| 2004/0180300 A1 * | 9/2004 | Minsek et al. ................ 430/329 |
| 2010/0112728 A1 * | 5/2010 | Korzenski et al. ................ 438/3 |
| 2013/0017636 A1 * | 1/2013 | Kim et al. ........................ 438/34 |

* cited by examiner

*Primary Examiner* — George Fourson, III
(74) *Attorney, Agent, or Firm* — Cantor Colburn LLP

(57) ABSTRACT

A composition for removing a photoresist, the composition including about 1% by weight to about 10% by weight of tetramethyl ammonium hydroxide ("TMAH"), about 1% by weight to about 10% by weight of an alkanol amine, about 50% by weight to about 70% by weight of a glycol ether compound, about 0.01% by weight to about 1% by weight of a triazole compound, about 20% by weight to about 40% by weight of a polar solvent, and water, each based on a total weight of the composition.

24 Claims, 10 Drawing Sheets

COMPOSITION FOR REMOVING A PHOTORESIST AND METHOD OF MANUFACTURING A THIN-FILM TRANSISTOR SUBSTRATE USING THE COMPOSITION

PRIORITY STATEMENT

This application claims priority to Korean Patent Application No. 2011-70014, filed on Jul. 14, 2011, and all the benefits accruing therefrom under 35 U.S.C. §119, the content of which in its entirety is herein incorporated by reference.

BACKGROUND OF THE INVENTION

1. Field of the Invention

This disclosure relates to a composition for removing a photoresist and a method of manufacturing a thin-film transistor substrate using the composition. More particularly, this disclosure relates to a composition for removing a photoresist which can be used in the manufacture of a thin-film transistor substrate, and a method of manufacturing a thin-film transistor substrate using the composition.

2. Description of the Related Art

Generally, a thin-film transistor substrate ("TFT substrate") includes a thin-film transistor, an insulating layer protecting the thin-film transistor, and a pixel electrode electrically connected to the thin film transistor. The insulating layer includes a contact hole exposing an output electrode of the thin-film transistor, and the pixel electrode makes contact with the output electrode through the contact hole.

When an inorganic layer including an inorganic material is formed on the TFT substrate, the inorganic layer may be undesirably thick. In order to provide a thinner inorganic layer, the insulating layer may further include an organic layer with the inorganic layer. A surface characteristic of the organic layer can be important because the organic layer planarizes the TFT substrate, and the pixel electrode is formed on the organic layer. However, uniformly forming the organic layer on an entire surface of the TFT substrate is difficult, and thus a rework process is performed in order to provide an organic layer having suitable surface characteristics. When the organic layer is confirmed to be defective after forming the organic layer, the defective organic layer is removed and a new organic layer is secondly formed on the TFT substrate in a rework process.

In removing the defective organic layer, when the defective organic layer is not entirely removed, a reliability of the secondly formed organic layer may be decreased so that the rework process may be repetitively performed. In addition, the output electrode may be corroded by a stripping composition for removing the organic layer, decreasing desirable characteristics of the thin-film transistor because the output electrode is already exposed through the contact hole in removing the organic layer.

The thin-film transistor is generally formed using a photolithography process. In the photolithography process, after a photoresist composition as a photosensitive material is coated, exposed, and developed to form a photoresist pattern, a lower thin film disposed under the photoresist pattern is etched using the photoresist pattern as an etch-stopping mask to form a thin film pattern. After forming the thin film pattern, the photoresist pattern is removed using a stripper. Commercially, the photoresist pattern is removed using a stripper which includes an amine compound as a main component regardless of a type of the photoresist composition. However, the stripper including the amine compound is limited in its ability to remove the photoresist pattern, depending on the type of the photoresist composition, and the stripper undesirably corrodes metal. Thus there remains a need for an improved composition for removing a photoresist, and methods of manufacturing thin film transistors using the composition.

BRIEF SUMMARY OF THE INVENTION

Example embodiments provide a composition for removing a photoresist capable of reducing corrosion of a metal layer and improving a removing ability of a photosensitive organic pattern.

Example embodiments also provide a method of manufacturing a TFT substrate using the composition.

According to an aspect, a composition for removing a photoresist includes about 1% by weight to about 10% by weight of tetramethyl ammonium hydroxide ("TMAH"), about 1% by weight to about 10% by weight of an alkanol amine, about 50% by weight to about 70% by weight of a glycol ether compound, about 0.01% by weight to about 1% by weight of a triazole compound, about 20% by weight to about 40% by weight of a polar solvent, and water, each based on a total weight of the composition.

In an embodiment, the glycol ether compound may include dimethylene glycol monomethyl ether ("MDG"), and the polar solvent may include N-methyl-2-pyrrolidone ("NMP").

According to another aspect, a composition for removing a photoresist includes about 1% by weight to about 5% by weight of tetramethyl ammonium hydroxide ("TMAH"), about 1% by weight to about 5% by weight of an alkanol amine, about 55% by weight to about 65% by weight of dimethylene glycol monomethyl ether ("MDG"), about 20% by weight to about 40% by weight of N-methyl-2-pyrrolidone ("NMP"), about 0.01% by weight to about 1% by weight of a triazole compound, and water, each based on a total weight of the composition.

According to another aspect, a method of manufacturing a thin-film transistor substrate is provided. The method includes providing a thin-film transistor on a base substrate; forming a first organic layer by disposing a photosensitive organic composition on the base substrate on which the thin-film transistor is disposed; removing at least a portion of the first organic layer by contacting the first organic layer with a composition for removing an organic pattern, the composition including about 1% by weight to about 10% by weight of tetramethyl ammonium hydroxide ("TMAH"), about 1% by weight to about 10% by weight of an alkanol amine, about 50% by weight to about 70% by weight of a glycol ether compound, about 0.01% by weight to about 1% by weight of a triazole compound, about 20% by weight to about 40% by weight of a polar solvent, and water, each based on a total weight of the composition; forming a second organic layer on the base substrate from which the first organic layer is removed, and forming a pixel electrode on the second organic layer, wherein the pixel electrode is electrically connected to the thin-film transistor, to manufacture the thin-film transistor substrate.

In an embodiment, the photosensitive organic composition may include a negative photoresist and a portion of the organic pattern, which is not exposed to a light, is soluble in a developing solution.

In another embodiment, the photosensitive organic composition may include a positive photoresist and a portion of the organic pattern, which is exposed to a light, is soluble in the developing solution.

In an embodiment, the thin-film transistor may include an electrode including aluminum or copper.

According to another aspect, a method of manufacturing a thin-film transistor substrate is provided. The method includes forming a metal layer on a base substrate; forming a photoresist pattern on the metal layer; patterning the metal layer using the photoresist pattern as an etch-stopping layer to form a first signal line and a first electrode of a thin-film transistor connected to the first signal line; removing at least a portion of the photoresist pattern by contacting the photoresist pattern with a composition for removing a photoresist, the composition including about 1% by weight to about 10% by weight of tetramethyl ammonium hydroxide ("TMAH"), about 1% by weight to about 10% by weight of an alkanol amine, about 50% by weight to about 70% by weight of dimethylene glycol monomethyl ether ("MDG"), about 20% by weight to about 40% by weight of N-methyl-2-pyrrolidone ("NMP"), about 0.01% by weight to about 1% by weight of a triazole compound, and water, each based on a total weight of the composition; and forming a pixel electrode electrically connected to the thin-film transistor to manufacture the thin-film transistor substrate.

In an embodiment, the photoresist pattern may be formed using a negative photoresist composition wherein a portion of the organic pattern, which is not exposed to a light, is soluble in a developing solution.

In another embodiment, the photoresist pattern may be formed using a positive photoresist composition wherein a portion of the organic pattern, which is exposed to a light, is soluble in the developing solution.

In an embodiment, the metal layer may include aluminum or copper.

The corrosion of a lower metal layer disposed under an organic layer, e.g., as a planarizing layer, or a photoresist pattern, e.g., as an etch-stopping layer, may be reduced to improve a removing ability of the organic layer and the photoresist pattern. Thus, a reliability of a rework process of the organic layer may be improved, and a removing time of the organic layer and the photoresist pattern may be decreased.

Also, when the organic layer or the photoresist pattern is formed using a positive or a negative photoresist composition, the organic layer and the photoresist pattern may be easily removed by the composition for removing a photoresist. Therefore, the rework process or the removing process of the photoresist pattern may be performed using a single stripping device regardless of a type of the photoresist composition to improve a productivity of a TFT substrate.

BRIEF DESCRIPTION OF THE DRAWINGS

The above and other features and advantages will become more apparent by describing in detailed example embodiments thereof with reference to the accompanying drawings, in which.

DETAILED DESCRIPTION OF THE INVENTION

Figure 1:
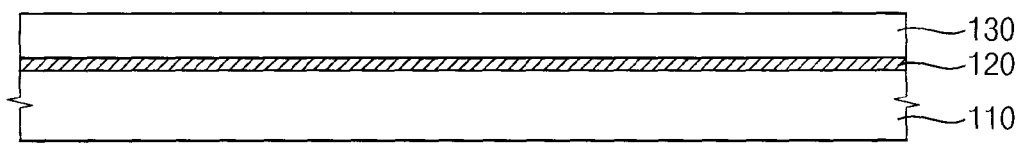
FIGS. 1 to 8 are cross-sectional views illustrating an embodiment of a method of manufacturing a TFT substrate.

Hereinafter, an embodiment of a composition for removing a photoresist, and an embodiment of a method of manufacturing a thin-film transistor ("TFT") substrate using the composition are be further disclosed with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Composition for Removing a Photoresist

A composition for removing a photoresist comprises tetramethyl ammonium hydroxide ("TMAH"), an alkanol amine, a glycol ether compound, a triazole compound, a polar solvent, and water. In another embodiment, the composition for removing a photoresist consists of TMAH, an alkanol amine, a glycol ether compound, a triazole-based compound, a polar solvent, and a remainder of water.

Herein, a layer removed by the composition for removing the photoresist is referred to as a "photosensitive organic pattern." The photosensitive organic pattern is a layer comprising a product of a photoresist composition, and may be the result of and/or formed via coating, exposing, developing, and washing a photoresist composition. Also, the "photosensitive organic pattern" may correspond to each of a "photoresist pattern" and an "organic layer," such as an organic layer formed in a hole.

Tetramethyl Ammonium Hydroxide

Tetramethyl ammonium hydroxide ("TMAH") is a strong alkaline compound and may strongly permeate into a polymer matrix of the photosensitive organic pattern. Thus, while not wanting to be bound by theory, it is believed that TMAH may break an intermolecular attractive force or an intra-molecular attractive force of the photosensitive organic pattern to decompose the photosensitive organic pattern.

In particular, it is believed that TMAH may easily permeate into the photosensitive organic pattern formed by exposing and hardening a negative photoresist composition to decompose the photosensitive organic pattern. The negative photoresist composition reacts upon exposure to light to become hardened in an exposed region, which is exposed to light, and an unexposed region is soluble in a developing solution and thus can be removed in a light-blocked (e.g., unexposed) region, which is not exposed to the light. For example, in an embodiment the negative photoresist composition may comprise an acrylic polymer, a photo-initiator, a binder, and a solvent. When the negative photoresist composition is provided with light, the photo-initiator initiates a hardening (e.g., polymerization) reaction, and the exposed portion of the negative photoresist composition cannot be substantially dissolved in the developing solution. In the negative photoresist composition of the light-blocked region, the photo-initiator is not substantially or effectively activated, so that the hardening reaction is not initiated, and the unexposed negative photoresist composition can be dissolved in the developing solution, and the unexposed portion of the negative photoresist composition can be removed from a substrate.

In addition, TMAH may easily permeate into the photosensitive organic pattern formed by exposing and hardening a positive photoresist composition to decompose the photosensitive organic pattern. The positive photoresist composition reacts (e.g., depolymerizes) upon exposure to light to be changed to a soluble state and can be solubilized in a developing solution in an exposed region, and is not soluble in a light-blocked region. For example, the positive photoresist composition may comprise a polymer, and a photo acid generator ("PAG"). When the positive photoresist composition is provided with light, the PAG generates an acid and the photoresist composition of the positive type is changed by the acid to the soluble state which soluble in the developing solution. The PAG in the positive photoresist composition in the light blocked region is inactivated, so that the positive photoresist composition not dissolved in the developing solution remains in the light blocked region.

When an amount of TMAH is less than about 1% by weight, based on a total weight of the composition for removing the photoresist, a permeated amount in the photosensitive organic pattern may be slight and a decomposed amount of the photosensitive organic pattern may be small so that the photosensitive organic pattern may be substantially not detached by the composition for removing the photoresist. When the amount of TMAH is larger than about 10% by weight, a lower metal layer disposed under the photosensitive organic pattern may be corroded, although the photosensitive organic pattern may be easily decomposed. Thus, in an embodiment the amount of TMAH may be about 1% by weight to about 10% by weight, specifically about 2% by weight to about 9% by weight, more specifically about 3% by weight to about 8% by weight, or about 4% by weight to about 7% by weight, based on the total weight of the composition for removing the photoresist.

More preferably, when the amount of TMAH is about 1% by weight to about 5% by weight, a removing ability of the photosensitive organic pattern may be desirable and corrosion of the lower metal layer may be suitable.

Alkanol Amine

While not wanting to be bound by theory, the alkanol amine is believed to permeate into the polymer matrix of the photosensitive organic pattern with the TMAH to swell a structurally weak portion in the photosensitive organic pattern, so that the photosensitive organic pattern is changed by the alkanol amine to be more easily removed from the substrate on which the lower metal layer is formed (e.g., disposed). The alkanol amine may permeate into the photosensitive organic pattern with TMAH.

Examples of the alkanol amine include diethanolamine, triethanolamine, or diglycolamine. These may be used alone or a combination thereof. Mono ethanol amine, isopropanol amine, and glycol amine may easily corrode the lower metal layer formed under the photosensitive organic pattern, and thus are preferably not used as the alkanol amine.

When an amount of the alkanol amine is less than about 1% by weight, based on the total weight of the composition for removing the photoresist, a time for removing the photosensitive organic pattern is lengthened which may increase an entire process time. In addition, when the amount of the alkanol amine is greater than about 10% by weight, the lower metal layer formed under the photosensitive organic pattern may be corroded by the alkanol amine. Thus, the amount of the alkanol amine is preferably about 1% by weight to about 10% by weight, specifically about 2% by weight to about 9% by weight, more specifically about 3% by weight to about 8% by weight, or about 4% by weight to about 7% by weight, based on the total weight of the composition for removing the photoresist. In an embodiment, when the amount of the alkanol amine is about 1% by weight to about 5% by weight, damage to the lower layer may be avoided and the time for removing the photosensitive organic pattern may be decreased.

Glycol Ether Compound

While not wanting to be bound by theory, the glycol ether compound is believed to help dissolve TMAH into the polar solvent and water. In addition, the glycol ether compound may decrease a surface tension of the photosensitive organic pattern to separate the photosensitive organic pattern from the lower metal layer, and thus a rinse-ability of the composition for removing the photoresist may be improved.

Since a freezing point of the glycol ether compound is low and an ignition point of the glycol ether compound is high, a storage stability of the composition for removing the photoresist may be improved by the glycol ether compound. In addition, the glycol ether compound may prevent components of the composition for removing the photoresist from being changed by volatilizing the composition for removing the photoresist.

Examples of the glycol ether compound include ethylene glycol methyl ether, ethylene glycol ethyl ether, ethylene glycol butyl ether, propylene glycol methyl ether, dimethylene glycol monomethyl ether, dimethylene glycol monoethyl ether, diethylene glycol monomethyl ether, diethylene glycol monoethyl ether, diethylene glycol monobutyl ether, triethylene glycol monomethyl ether, dipropylene glycol mono ether, dipropylene glycol monoethyl ether, dipropylene glycol monobutyl ether, monoethylene glycol, or methyl ethylene glycol. These may be used alone or a combination thereof.

In an embodiment, dimethylene glycol monoethyl ether may be used as the glycol ether compound. Since a molecular weight of dimethylene glycol monoethyl ether is smaller than that of other examples of the glycol ether compound, an embodiment of the compound for removing the photoresist comprising dimethylene glycol monoethyl ether may be easily washed by a washing solution in a washing process performed after removing the photosensitive organic pattern.

When an amount of the glycol ether compound is less than about 50% by weight, based on the total weight of the composition for removing the photoresist, the amount of TMAH, the alkanol amine, and/or the polar solvent may be relatively increased in order to maintain the removing ability of the photosensitive organic composition by the composition for removing the photoresist and the lower metal layer may be easily corroded. In addition, a solubility of the photosensitive organic pattern for the glycol ether compound may be decreased so that the removing ability of the photosensitive organic pattern may be decreased and the rinse-ability is reduced when the amount of the glycol ether compound is less than about 50%. When the amount of the glycol ether compound is larger than about 70% by weight, the lower metal layer may be corroded by the glycol ether compound and the amount of TMAH, the alkanol amine, and/or the polar solvent is relatively decreased so that the glycol ether compound may interrupt removing the photosensitive organic pattern. Therefore, the amount of the glycol ether compound is preferably about 50% by weight to about 70% by weight, specifically about 52% by weight to about 68% by weight, more specifically about 54% by weight to about 66% by weight, or about 56% by weight to about 64% by weight, based on the total weight of the composition for removing the photoresist. In an embodiment, when the amount of the glycol ether compound is about 55% by weight to about 65% by weight, the damage of the lower metal layer may be reduced, and the removing ability of the photosensitive organic pattern may be improved.

Triazole Compound

The triazole compound may reduce the corrosion of the lower metal layer. While not wanting to be bound by theory, it is believed that the triazole compound is physically and chemically absorbed with metal of the lower metal layer to substantially or effectively prevent the lower metal layer from being corroded. In an embodiment, the triazole compound comprises at least one of a triazole compound and a tolytriazole compound.

When an amount of the triazole compound is less than about 0.01% by weight, based on the total weight of the composition for removing the photoresist, the triazole compound may not prevent the lower metal layer from being corroded. Thus, the lower metal layer may be corroded by the composition for removing the photoresist when the amount of the triazole compound is less than about 0.01% by weight in the composition for removing the photosensitive organic pattern. In addition, when the amount of the triazole compound is larger than about 1% by weight, the triazole compound may interrupt permeation into and dissolution of the photosensitive organic pattern. The triazole compound may be included in an amount of about 0.01% by weight to about 1% by weight, specifically about 0.05% by weight to about 0.9% by weight, more specifically about 0.1% by weight to about 0.8% by weight, based on the total weight of the composition for removing the photoresist. In a particular embodiment, the amount of the triazole compound is between about 0.01% by weight and about 1% by weight.

Polar Solvent

While not wanting to be bound by theory, it is believed that the polar solvent permeates into the photosensitive organic pattern with the alkanol amine to swell the photosensitive organic pattern, so that the photosensitive organic pattern is changed by the polar solvent to be more easily removed from the substrate on which the lower metal layer is formed. In addition, when the photosensitive organic pattern may be a gel, the polar solvent may decompose the gel photosensitive organic pattern so that the gel state is removed from the substrate as unit-molecules, thereby dissolving the photosensitive organic pattern. The gel photosensitive organic pattern removed from the substrate may be decomposed by the polar solvent and can be prevented from re-attaching to the substrate on which the lower metal layer is formed. In particular, when the polar solvent includes an amine group, the polar solvent assists the alkanol amine permeated into the photosensitive organic pattern.

Examples of the polar solvent include dimethyl acetamide, N-methyl-2-pyrrolidone ("NMP"), dimethyl formamide, or dimethyl sulfoxide. These may be used alone or a combination thereof. Preferably, NMP may be used as the polar solvent. In particular, NMP is excellent in preventing the lower metal layer from being corroded and in improving the removing ability of the photosensitive organic pattern.

When an amount of the polar solvent is less than about 20% by weight, based on the total weight of the composition for removing the photoresist, it can be difficult to swell the photosensitive organic pattern so that the removing ability may be low. When the amount of the polar solvent is greater than about 40% by weight, the polar solvent may interrupt the function of other components of the composition for removing the photoresist, decreasing a detaching ability. In an embodiment, the amount of the polar solvent is about 20% by weight to about 40% by weight, specifically about 22% by weight to about 38% by weight, more specifically about 24% by weight to about 36% by weight, or about 26% by weight to about 34% by weight, based on the total weight of the composition for removing the photoresist.

Water

The composition for removing the photoresist includes water with the polar solvent. For example, water may be deinonized water ("DI water"). Water may dissolve the photosensitive organic pattern with the polar solvent. Water may be added into a combination of TMAH, the alkanol amine, the glycol ether compound, the triazole compound, and the polar solvent so that the total weight of the composition for removing the photoresist becomes about 100% by weight. For example, an amount of water, based on the total weight of the composition for removing the photoresist, may be about 7.99% by weight to about 27.99% by weight, specifically about 9% by weight to about 27% by weight, more specifically about 11% by weight to about 25% by weight, based on the total weight of the composition for removing the photoresist. In another embodiment, the content of water may be about 0.01 to about 72%, based on the total weight of the composition for removing the photoresist.

In the composition for removing the photoresist, the composition for removing the photoresist includes TMAH with the alkanol amine so that the removing ability of the photosensitive organic pattern formed from the negative photoresist composition having a high photo-sensitivity may be improved. Thus, the photosensitive organic pattern, formed from the negative photoresist composition which is capable of forming the photosensitive organic pattern in a short process time, may be removed in a short time so that an entire time of a manufacturing process may be decreased.

Further, the composition for removing the photoresist may easily remove a photosensitive organic pattern formed from the positive photoresist composition. Therefore, a stripping device using the composition for removing the photoresist may be used in a stripping process of the substrate on which the photosensitive organic pattern is formed as a removing target, regardless of the negative or positive type of the photoresist composition. Then, a substrate, for example a display substrate, may be manufactured using a single stripping device regardless of the type of the photosensitive organic pattern, to improve a manufacturing productivity.

Furthermore, the composition for removing the photoresist includes a component in a range capable of reducing or effectively eliminating the corrosion of the lower metal layer so that the corrosion of the lower metal layer may be reduced in removing the photosensitive organic pattern. Thus, the composition for removing the photoresist may substantially or effectively prevent a reliability of a manufacturing process from being decreased by the corrosion of the lower metal layer.

Hereinafter, a method of manufacturing a TFT substrate using the composition for removing the photoresist will be further illustrated referring to FIGS. 1 to 8.

Method of Manufacturing a TFT Substrate

FIGS. 1 to 8 are cross-sectional views illustrating an embodiment of method of manufacturing a TFT substrate.

Referring to FIG. 1, a gate metal layer 120 is formed on a base substrate 110 and a first photoresist layer 130 is formed on the gate metal layer 120.

The gate metal layer 120 may comprise an aluminum, or copper. A combination comprising at least one of the foregoing can be used. For example, the gate metal layer 120 may have a single layer including aluminum or copper, a structure comprising an aluminum layer and a molybdenum layer (e.g., an Al/Mo structure), a structure comprising a molybdenum layer, an aluminum layer, and a molybdenum layer (e.g., a Mo/Al/Mo structure), a structure comprising a molybdenum layer and an aluminum layer (e.g., a Al/Mo structure), or a structure comprising a titanium layer and a copper layer (e.g., a Ti/Cu structure).

A negative photoresist composition may be coated to form the first photoresist layer 130 on the gate metal layer 120. For example, the negative photoresist composition may include a polymer and a photo-initiator.

Figure 2:
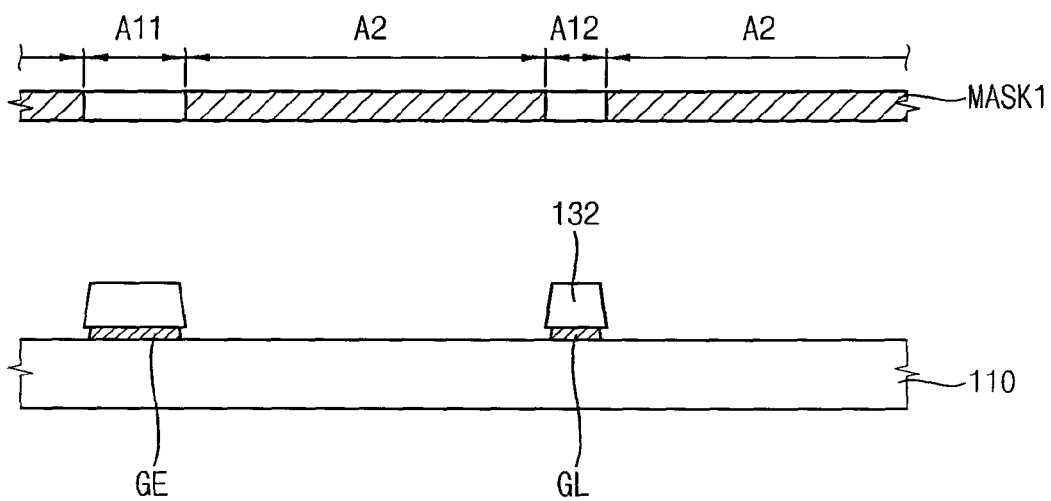

Referring to FIG. 2, a first mask MASK1 is disposed over the first photoresist layer 130, and the first photoresist layer 130 is exposed, developed, and washed to form a first photoresist pattern 132.

The first photoresist pattern 132 is formed in forming regions of a gate line GL as a signal line extending in a direction of the base substrate 110, and a control electrode GE connected a parallel gate line with the gate line GL.

Since the first photoresist layer 130 is hardened in an exposed region and is removed by a developing solution in a light-blocked region, light-transmittance parts A11 and A12, which transmit light of the first mask MASK1, are disposed in the forming regions of the gate line GL and the control electrode GE, and a light-blocking part A2 of the first mask MASK1 is disposed in the remaining region, i.e., in a region except the regions in which the light-transmittance parts A11 and A12 are disposed. Thus, the first photoresist layer 130, which is in a region corresponding to the light-blocking part A2, is removed by the developing solution in a developing process, and the first photoresist layer 130, which is in a region corresponding to the transmittance parts A11 and A12, is hardened by light and remains on the gate metal layer 120.

The gate metal layer 120 is etched using the first photoresist pattern 132 as an etch-stopping layer to form the control electrode GE and the gate line GL. After forming the control electrode GE and the gate line GL, the first photoresist pattern 132 is removed using a composition for removing a photoresist. In an embodiment, the composition for removing the photoresist includes about 1% by weight to about 10% by weight of TMAH, about 1% by weight to about 10% by weight of an alkanol amine, about 50% by weight to about 70% by weight of a glycol ether compound, about 0.01% by weight to about 1% by weight of a triazole compound, about 20% by weight to about 40% by weight of a polar solvent, and water, each based on a total weight of the composition. In another embodiment, the composition for removing the photoresist consists of about 1% by weight to about 10% by weight of TMAH, about 1% by weight to about 10% by weight of an alkanol amine, about 50% by weight to about 70% by weight of a glycol ether compound, about 0.01% by weight to about 1% by weight of a triazole compound, about 20% by weight to about 40% by weight of a polar solvent, and a remainder of water, each based on a total weight of the composition. The composition for removing the photoresist used in removing the first photoresist pattern 132 is substantially the same as the above illustrated composition for removing the photoresist, and thus any further repetitive description will be omitted. In a stripping process, the corrosion of the control electrode GE and the gate line GL may be minimized by the composition for removing the photoresist. In addition, a process time of the stripping process may be decreased.

Different from the above description illustrated in FIGS. 1 and 2, the first photoresist layer 130 may be formed from a positive photoresist composition. Then, the positive photoresist composition may include a polymer and a photo-initiator. When the first photoresist pattern 132 is formed using the positive photoresist composition, a mask in which the light-transmittance parts A11 and A12 of the first mask MASK1 are replaced with a light-blocking part, and wherein the light-blocking part A2 of the first mask MASK1 is replaced with a light-transmittance part, is used in an exposure process. Although the first photoresist pattern 132 is formed using the positive photoresist composition, the composition for removing the photoresist disclosed above illustrated may be used to remove the first photoresist pattern 132.

Figure 3:
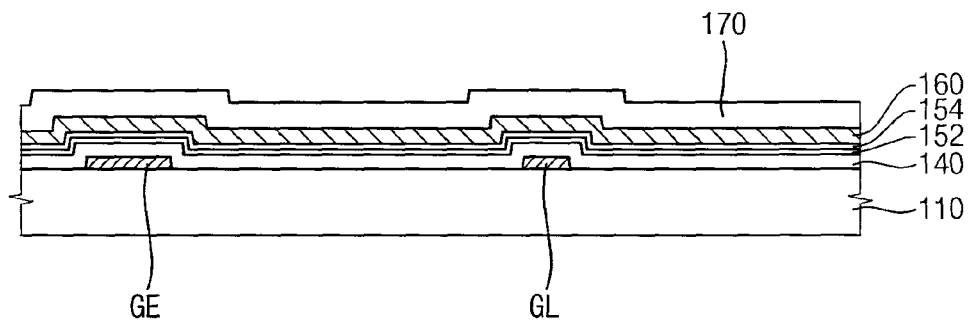

Referring to FIG. 3, a gate insulating layer 140, a semiconductor layer 152 and an ohmic contact layer 154 are sequentially formed on the base substrate 110 on which the control electrode GE and the gate line GL are formed, and a data metal layer 160 and a second photoresist layer 170 are formed on the ohmic contact layer 154.

The gate insulating layer 140 may be formed from an inorganic material, such as silicon oxide or silicon nitride. The semiconductor layer 152 may include amorphous silicon and the ohmic contact layer 154 may include amorphous silicon doped with an n-type dopant at a high concentration. Alternatively, the semiconductor layer 152 may include a metal oxide semiconductor and the ohmic contact layer 154 may be omitted.

The data metal layer 160 may include an aluminum layer or a copper layer. For example, the data metal layer 160 may have a single layer including aluminum or copper, a structure comprising an aluminum layer and molybdenum layer (e.g., an Al/Mo structure), a structure comprising a molybdenum layer, an aluminum layer, and a molybdenum layer (e.g., Mo/Al/Mo structure), a structure comprising a molybdenum layer and an aluminum layer (e.g., a Al/Mo structure) or a structure comprising a titanium layer and a copper layer (e.g., a Ti/Cu structure).

The second photoresist layer 170 may be formed via coating a negative photoresist composition. The negative photoresist composition is substantially the same as the photoresist composition forming the first photoresist layer 130, and thus any repetitive description will be omitted.

Figure 4:
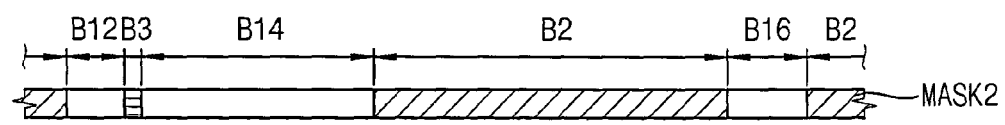
Figure 4:
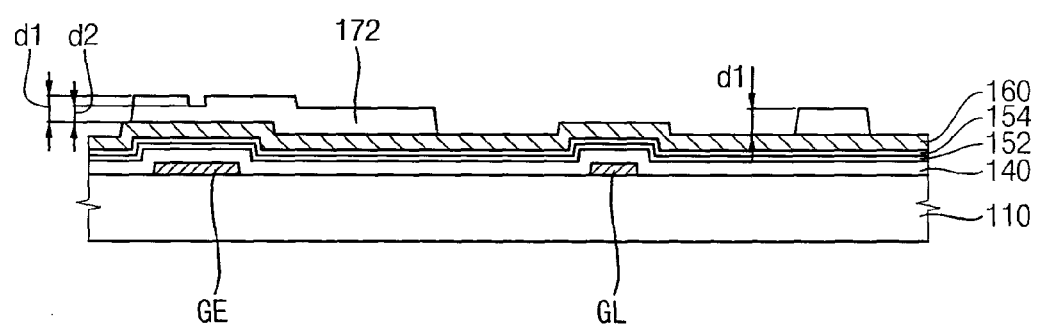

Referring to FIG. 4, a second mask MASK2 is disposed over the second photoresist layer 170 and the second photoresist layer 170 is exposed, developed, and washed to form a second photoresist pattern 172.

The second mask MASK2 includes light-transmittance parts B12, B14, and B16, a light-blocking part B2, and a semi-transmittance part B3. The light-transmittance parts B12, B14, and B16 are disposed in forming regions of a data line DL as a signal line crossing the gate line GL, an input electrode SE connected to a parallel data line with the data line DL, and an output electrode DE spaced apart from the input electrode SE. The semi-transmittance part B3 is disposed in a channel region (Refer to FIG. 6) between the input electrode SE and the output electrode DE. The semi-transmittance part B3 diffracts or partially blocks light so that an intensity of light passing through the semi-transmittance part B3 and provided to the second photoresist layer 170 is less than an intensity of each of the light-transmittance parts B12, B14, and B16 and is larger than an intensity of the light-blocking part B2.

After performing the developing process, a first thickness d1 of the second photoresist pattern 172 in regions corresponding to the light-transmittance parts B12, B14, and B16 is thicker than a second thickness d2 of the second photoresist pattern 172 in a region corresponding to the semi-transmittance part B3.

Figure 5:
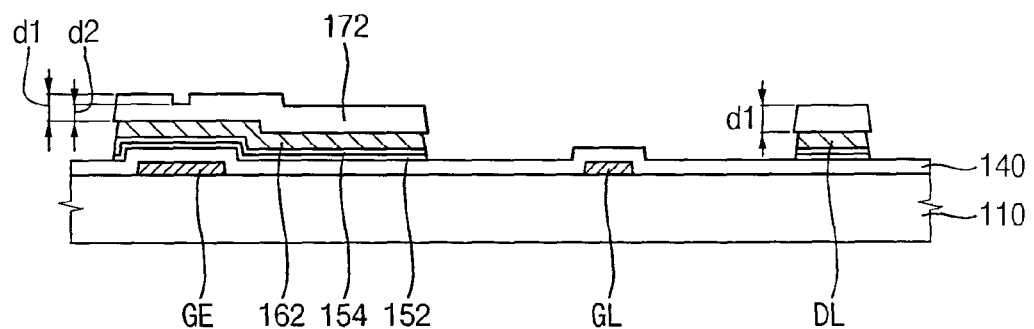

Referring to FIG. 5, the data metal layer 160 is etched using the second photoresist pattern 172 as an etch-stopping layer to form an intermediate pattern 162, the data line DL, and the parallel data line with the data line DL. The intermediate pattern 162 is connected to the parallel data line with the data line DL.

The semiconductor layer 152 and the ohmic contact layer 154 are patterned using the second photoresist pattern 172, the intermediate pattern 162, and the data line DL. The patterned semiconductor layer 152 and ohmic contact layer 154 are disposed under the intermediate pattern 162 to substantially function as a semiconductor pattern of a thin-film transistor SW. The patterned semiconductor layer 152 and ohmic contact layer 154 disposed under the data line DL and the parallel data line may serve as a dummy pattern.

After patterning the semiconductor layer 151 and the ohmic contact layer 154, the second photoresist pattern 172 is ashed to decrease an entire thickness of the second photoresist pattern 172, and then a portion having the second thickness d2 in the second photoresist pattern 172 is removed to form a residue pattern (not shown). The intermediate pattern 162 and the ohmic contact layer 154 are removed using the residue pattern as an etch-stopping pattern to form the input electrode SE and the output electrode DE.

The residue pattern on the base substrate 110, on which the input electrode SE and the output electrode DE are formed, is removed using the composition for removing the photoresist. Although the residue pattern is removed using the composition for removing the photoresist, the damage to the input electrode SE, the output electrode DE, and the data line DL may be reduced. In addition, a time for removing the residue pattern may be decreased.

Alternatively, the second photoresist layer 170 may be formed from a positive photoresist composition, and the residue pattern may be removed using the composition for removing the photoresist when the residue pattern is formed from the positive photoresist composition.

Figure 6:
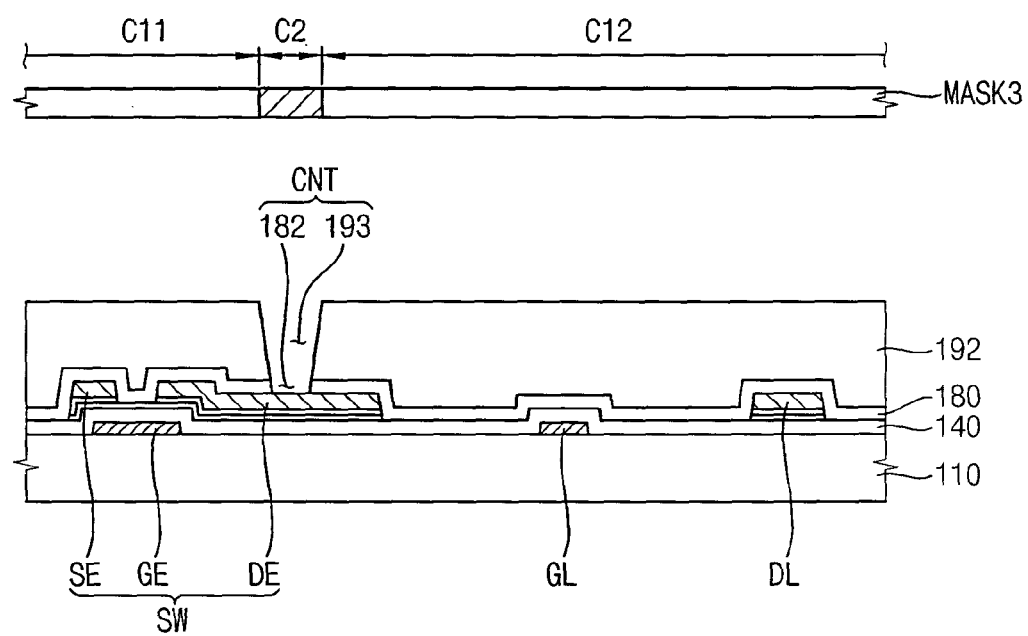

Referring to FIG. 6, an inorganic layer 180 is formed on the base substrate 110 on which the thin-film transistor SW including the input electrode SE, the output electrode DE, and the control electrode GE, and the gate line GL and the data line DL are formed.

The inorganic layer 180 may be entirely formed on the base substrate 110 on which the thin-film transistor SW, the gate line GL, and the data line DL are formed. The inorganic layer 180 may be formed from an inorganic material, such as silicon oxide or silicon nitride. For example, the inorganic layer 180 may be a silicon nitride layer. Alternatively, when the semiconductor layer 152 includes a metal oxide semiconductor, the inorganic layer 180 and the inorganic layer 180 may have a multi-layered structure including the silicon oxide layer and the silicon nitride layer.

Then, a first organic layer 192 is formed on the inorganic layer 180.

The first organic layer 192 is formed via coating, exposing, developing, and washing a negative photoresist composition.

The negative photoresist composition has a high photosensitivity so that a patterning reliability is high and a patterning time may be decreased. The negative photoresist composition may include a polymer, and a photo-initiator. The negative photoresist composition is substantially the same as the negative photoresist composition above illustrated, and thus any repetitive description will be omitted.

For example, after the negative photoresist composition is entirely coated on the base substrate 110 to form a coating layer, a third mask MASK3 is disposed over the coating layer and then the coating layer is exposed, developed, and washed to form the first organic layer 192. The first organic layer 192 includes a first hole 193 exposing a contact region of the output electrode DE. A light-blocking part C2 of the third mask MASK3 is disposed in a region corresponding to the first hole 193 so that a portion of the coating layer not receiving light is removed in a developing process to form the first hole 193. The coating layer in the remaining region except the first hole 193 receives light through light-transmittance parts C11 and C12 and is hardened and remains on the base substrate 110.

The inorganic layer 180 is etched using the first organic layer 192 as an etch-stopping layer to form a second hole 182 exposing the output electrode DE. Thus, a contact hole CNT of the first organic layer 192 and the inorganic layer 180 defined by the first and second holes 193 and 182 is formed in the contact region. A region in which the contact hole CNT is formed corresponds to the light-blocking part C2 of the third mask MASK3 so that an etched surface of the first organic layer 192 defining the contact hole CNT may have a tapered structure. The etched surface has the tapered structure so that a pixel electrode PE (Refer to FIG. 8) may be stably formed without being broken.

When the etched surface of the first organic layer 192 forming the contact hole collapses or a surface planarizing characteristic of the first organic layer 192 is poor, a reliability of the pixel electrode PE formed after the first organic layer 192 may be decreased and movement of liquid crystal molecules may be affected, decreasing desirable product characteristics. According to the above problems, a display quality may be decreased. In order to solve the above problems, when the first organic layer 192 is confirmed to be defective, a rework process is performed to selectively remove the first organic layer 192 from the base substrate 110 without throwing away the base substrate 110 on which the thin-film transistor SW is already formed. After the first organic layer 192 is removed, sequential processes are performed on the base substrate 110 on which the thin-film transistor SW is formed.

Figure 7:
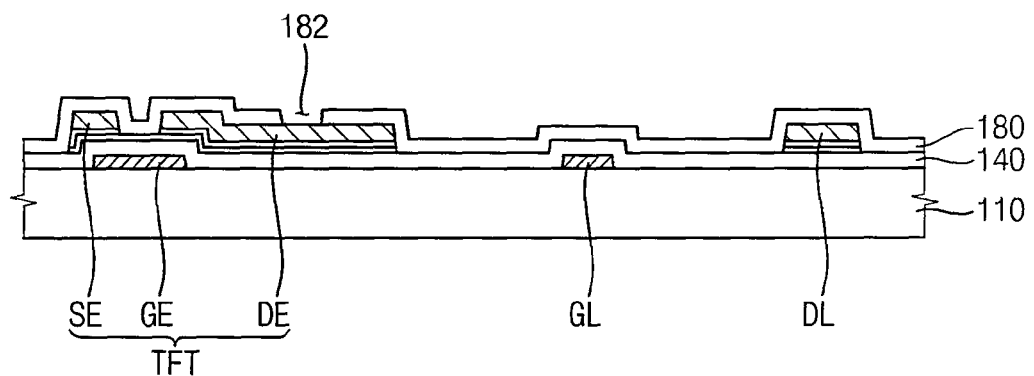

Referring to FIG. 7, the first organic layer 192 is removed using the composition for removing an organic pattern. The composition for removing the organic pattern may comprise about 1% by weight to about 10% by weight of TMAH, about 1% by weight to about 10% by weight of an alkanol amine, about 50% by weight to about 70% by weight of a glycol ether compound, about 0.01% by weight to about 1% by weight of a triazole compound, about 20% by weight to about 40% by weight of a polar solvent, and water, each based on a total weight of the composition. The composition for removing the organic pattern used for removing the first organic layer 192 is substantially the same as the composition for removing the photoresist above illustrated. Thus, any repetitive description is omitted.

Although the first organic layer 192 is removed in a state exposing the output electrode DE through the second hole 182 already formed in the inorganic layer 180, the composition for removing the organic pattern may reduce the corrosion of the output electrode DE. In addition, although the first organic layer 192 is formed using the negative photoresist composition, the first organic layer 192 may be entirely removed at a fast rate so that a process time for removing the first organic layer 192 may be decreased.

Figure 8:
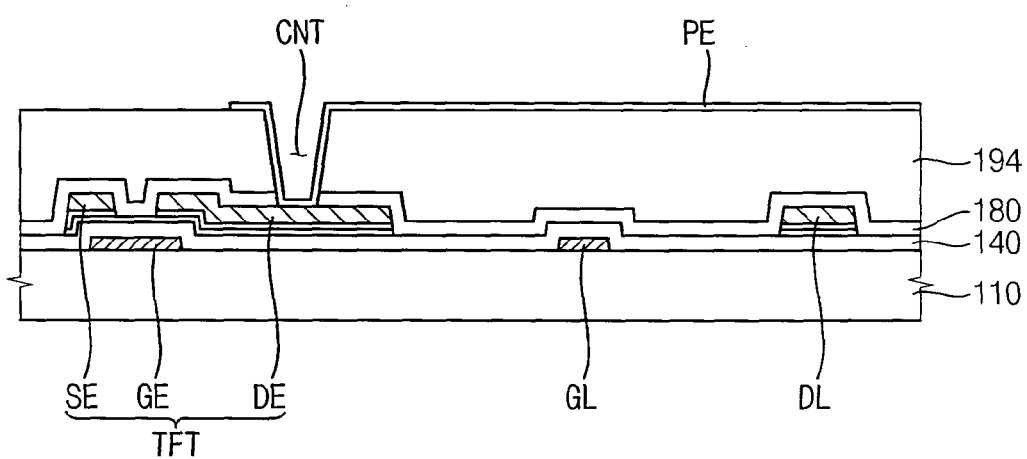

Referring to FIG. 8, a second organic layer 194 is formed on the inorganic layer 180 in which the second hole 182 is formed, using a composition substantially the same as the negative photoresist composition forming the first organic layer 192. Forming the second organic layer 194 is substantially the same as the forming of the first organic layer 192, and thus any repetitive description may be omitted.

Therefore, the output electrode DE is exposed thorough the contact hole CNT formed in the second organic layer 194 and the inorganic layer 180. When the second organic layer 194 is confirmed to be good, the second organic layer 194 is substantially a planarized layer of the TFT substrate.

An electrode layer may be formed on the second organic layer 194 and may be patterned to form the pixel electrode PE. The pixel electrode PE may be connected to the thin-film transistor SW through the contact hole CNT.

When the second organic layer 194 is confirmed to be defective, or it is desirable to remove all or a portion of the second organic layer, the second organic layer 194 may be removed via substantially the same process as removing the first organic layer 192 and a third organic layer (not shown) may be formed. Here, the third organic layer serves as the planarized layer of the TFT substrate. Then, the pixel electrode PE may be formed on the third organic layer.

According to the method of manufacturing the TFT substrate, when a photoresist pattern is formed using the negative photoresist composition in a photolithography process, the photoresist pattern may be easily removed using the composition for removing the photoresist for a short period. In addition, if it is desirable to remove the first organic layer, e.g., when the first organic layer 192 is confirmed to be defective, the first organic layer 192 may be easily removed using the composition for removing the organic pattern, which is substantially the same as the composition for removing the photoresist, in the rework process. Here, the composition for removing the organic pattern may reduce the corrosion of the output electrode DE.

Hereinafter, the composition for removing the photoresist and properties thereof will be further illustrated through Example and Comparative Example as a composition for removing a photoresist. However, this disclosure shall not be construed as limited to the examples set forth herein.

Manufacture of a Composition for Removing a Photoresist

EXAMPLE 1

Based on a total weight of a composition for removing a photoresist, about 5% by weight of tetramethyl ammonium hydroxide ("TMAH"), about 59.9% by weight of dimethylene glycol monomethyl ether ("MDG"), about 5% by weight of an alkanol amine, about 0.1% by weight of tolytriazole, and about 10% by weight of deionized ("DI") water were mixed to prepare the composition for removing the photoresist according to Example 1 of the present invention.

Compositions for removing a photoresist according to Example 2 and 3 including the foregoing components and in the amounts shown in Table 1 were prepared via substantially the same method as preparing the composition for removing the photoresist according to Example 1.

TABLE 1

| Component | Example 2 | Example 3 |
| --- | --- | --- |
| TMAH | about 4.0% by weight | about 3.0 by weight |
| MDG | about 50.9% by weight | about 51.9% by weight |
| NMP | about 30.0% by weight | about 25.0% by weight |
| alkanol amine | about 5.0% by weight | about 5.0% by weight |
| tolytriazole | about 0.1% by weight | about 0.1% by weight |
| DI water | about 10% by weight | about 10% by weight |

COMPARATIVE EXAMPLE 1 AND 2

Compositions for removing a photoresist according to Comparative Examples 1 and 2 were prepared using the components as shown in Table 2, using substantially the same method as preparing the composition for removing the photoresist according to Example 1.

TABLE 2

| Component | Comparative Example 1 | Comparative Example 2 |
| --- | --- | --- |
| TMAH | about 0.5% by weight | about 0.1% by weight |
| MDG | about 24.5% by weight | about 79.9% by weight |
| NMP | about 60.0% by weight | about 25.0% by weight |
| alkanol amine | about 5.0% by weight | about 5.0% by weight |
| DI water | about 10% by weight | about 10% by weight |

Evaluation of Properties of a Composition for Removing a Photoresist

Manufacturing Substrate Sample 1 to 10

Figure 9A:
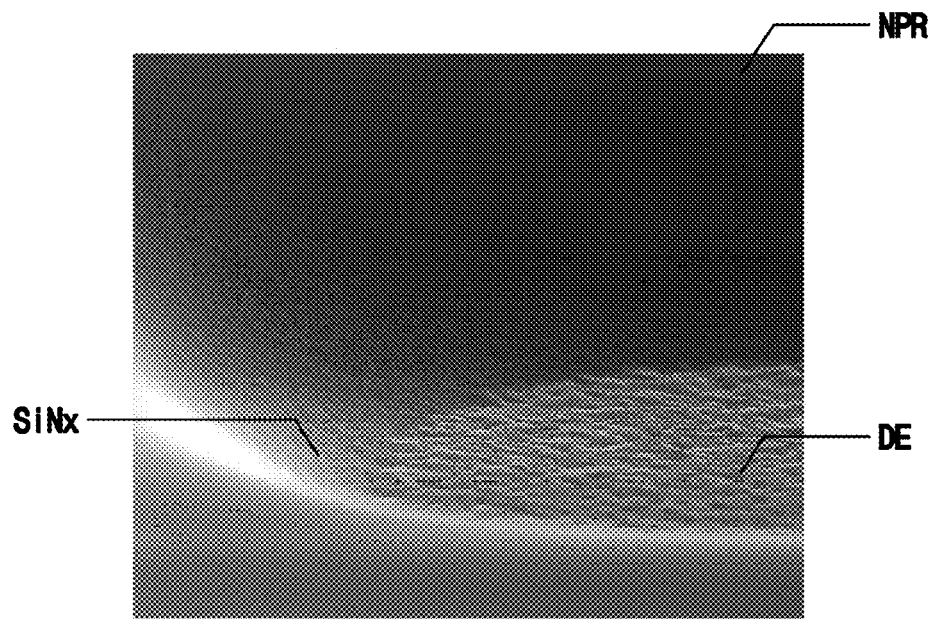
FIG. 9A is a scanning electron micrograph ("SEM") of an embodiment of a contact region of an organic layer of a negative photoresist.

A thin-film transistor, wherein each of an input electrode and an output electrode includes a copper metal layer, was formed on a base substrate, and an inorganic layer including silicon nitride was formed on the thin-film transistor. After forming the inorganic layer, a negative photoresist composition was coated, exposed, developed, and washed to form an organic layer including a first hole on the inorganic layer. Then, a second hole exposing the output electrode was formed in the inorganic layer using the organic layer including the first hole as an etch-stopping layer so that Substrate Sample 1 was prepared. In addition, Substrate Samples 2 to 5 were prepared via substantially the same method as preparing Substrate Sample 1. In Substrate Sample 1, a contact region of the output electrode exposed through the first and second holes was imaged using a scanning electrode microscope, and the thus scanning electron micrograph ("SEM") of the contact region is illustrated in FIG. 9A.

Substrate Samples 6 to 10 were prepared using a positive photoresist composition in place of the negative photoresist composition via substantially the same method as preparing Substrate Samples 1 to 5. In Substrate Sample 6, the contact region was imaged using the scanning electrode microscope, and the SEM is provided in FIG. 10A.

EXPERIMENT 1

Evaluation of Removing Ability of an Organic Layer

The organic layer was removed using the composition for removing the photoresist according to Example 1 maintained in a temperature of about 50° C. in each of Substrate Sample 1 to Substrate Sample 6. The contact region removing the organic layer in each of the Substrate Sample 1 to Substrate Sample 6 was imaged using the scanning electrode microscope, and the SEMs are provided in FIGS. 9B and 10B.

For each of Substrate Samples 2 and 7, the organic layer was removed using the composition for removing the photoresist according to Example 2 maintained in a temperature of about 50° C.

For each of Substrate Sample 3 and 8, the organic layer was removed using the composition for removing the photoresist according to Example 3 maintained in a temperature of about 50° C.

For each of Substrate Sample 4 and 9, the organic layer was removed using the composition for removing the photoresist according to Comparative Example 1 maintained in a temperature of about 50° C.

For each of Substrate Sample 5 and 10, the organic layer was removed using the composition for removing the photoresist according to Comparative Example 2 maintained in a temperature of about 50° C.

For each of Substrate Sample 1 to 10, a time removing the organic layer was measured, and thus the obtained results are illustrated in Table 3. In Table 3, "○" represents that the time is less than about 1 minute, and "x" represents that the time is greater than about 1 minute.

TABLE 3

| | Example 1 | Example 2 | Example 3 | Comparative Example 1 | Comparative Example 2 |
| --- | --- | --- | --- | --- | --- |
| Substrate Sample 1 | ○ | — | — | — | — |
| Substrate Sample 2 | — | ○ | — | — | — |
| Substrate Sample 3 | — | — | ○ | — | — |
| Substrate Sample 4 | — | — | — | x | — |
| Substrate Sample 5 | — | — | — | — | x |
| Substrate Sample 6 | ○ | — | — | — | — |
| Substrate Sample 7 | — | ○ | — | — | — |
| Substrate Sample 8 | — | — | ○ | — | — |
| Substrate Sample 9 | — | — | — | ○ | — |
| Substrate Sample 10 | — | — | — | — | x |

Referring to Table 3, each of the compositions for removing the photoresist according to Examples 1 to 3 removes the organic layer of each of Substrate Samples 1 to 3 within about 1 minute. In addition, each of the compositions for removing the photoresist according to Example 1 to 3 removes the organic layer of each of Substrate Sample 6 to 8 within about 1 minute.

In contrast, although the composition for removing the photoresist according to Comparative Example 1 removes the organic layer of Substrate Sample 9 within about 1 minute, the organic layer of Substrate Sample 4 is not removed within about 1 minute. In addition, the composition for removing the photoresist according to Comparative Example 2 does not remove the organic layer of each of the Substrate Sample 5 and 10 within about 1 minute.

The compositions for removing the photoresist according to Example 1 to 3 may easily remove the organic layer formed from the negative photoresist composition for a short period. In addition, the compositions for removing the photoresist according to Example 1 to 3 may easily remove the organic layer formed from the positive photoresist composition for a short period.

Figure 9B:
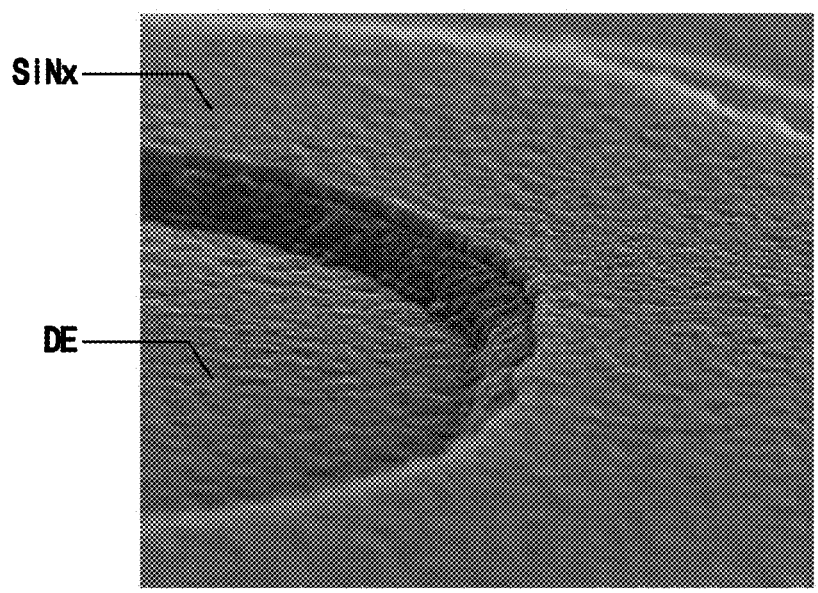
FIG. 9B is a SEM of an embodiment of a substrate after removing the organic layer of the negative type in FIG. 9A using a composition for removing a photoresist according to Example 1.

FIG. 9A is a scanning electron micrograph ("SEM") of a contact region of an organic layer of a negative photoresist, and FIG. 9B is a SEM of a substrate after removing the organic layer of the negative photoresist in FIG. 9A using a composition for removing a photoresist according to Example 1. In FIGS. 9A and 9B, the output electrode is represented by "DE," the inorganic layer is represented by "SiNx," and the organic layer of Substrate Sample 1 is represented by "NPR."

Referring to FIG. 9A, the contact region of the output electrode DE is exposed via the inorganic layer SiNx and the organic layer NPR. After this, when the organic layer NPR is removed using the composition for removing the photoresist according to Example 1, the organic layer NPR is removed as illustrated in FIG. 9B to expose the output electrode DE by the inorganic layer SiNx. Referring to FIG. 9B with Table 3, the composition for removing the photoresist according to Example 1 removes the organic layer NPR within about 1 minute.

Figure 10A:
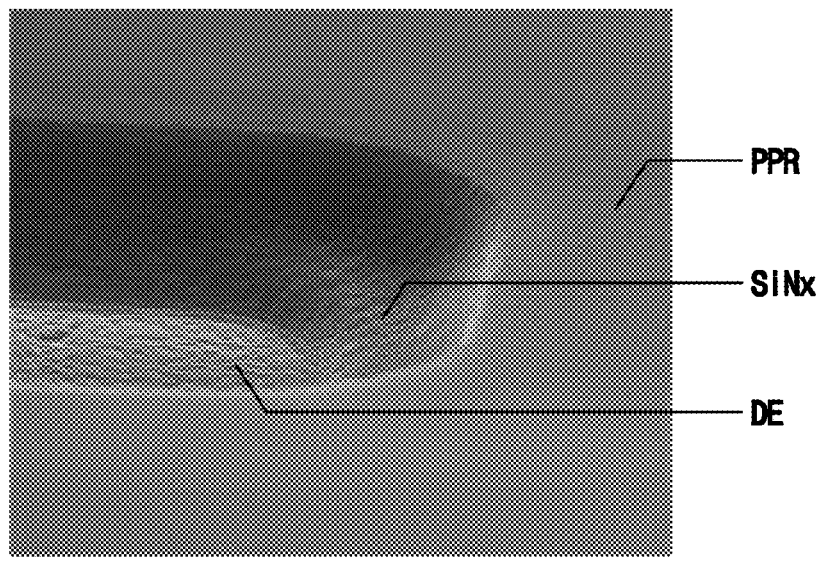
FIG. 10A is a SEM of an embodiment of contact region of an organic layer of a positive photoresist.
Figure 10B:
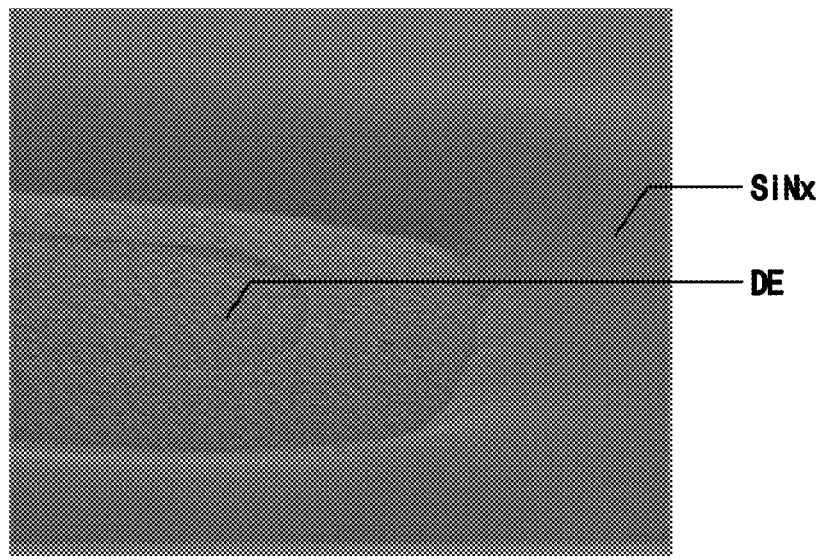
FIG. 10B is a SEM of an embodiment of a substrate removing the organic layer of the positive photoresist in FIG. 10A using the composition for removing the photoresist according to Example 1.

FIG. 10A is a SEM of a contact region of a positive type organic layer, and FIG. 10B is a SEM of a substrate upon removing the positive organic layer in FIG. 10A using the composition for removing the photoresist according to Example 1. In FIGS. 10A and 10B, the output electrode is represented by "DE," the inorganic layer is represented by "SiNx," and the organic layer of Substrate Sample 5 is represented by "PPR."

Referring to FIG. 10A, the contact region of the output electrode DE is exposed via the inorganic layer SiNx and the organic layer PPR. After this, when the organic layer PPR is removed using the composition for removing the photoresist according to Example 1, the organic layer PPR is removed as illustrated in FIG. 10B to exposed the output electrode DE by the inorganic layer SiNx. Referring to FIG. 10B with Table 3, the composition for removing the photoresist according to Example 1 removes the organic layer PPR within about 1 minute.

Manufacturing of Metal Sample 1 to 10

An aluminum layer was formed on a substrate and was patterned to manufacture Metal Sample 1 including an aluminum metal pattern. Metal Samples 2 to 5 were manufactured via substantially the same method as manufacturing Metal Sample 1. In Metal Sample 1, an etched surface of the aluminum metal pattern was imaged using a scanning electrode microscope, and the SEM is provided in FIG. 11A.

Figure 12A:
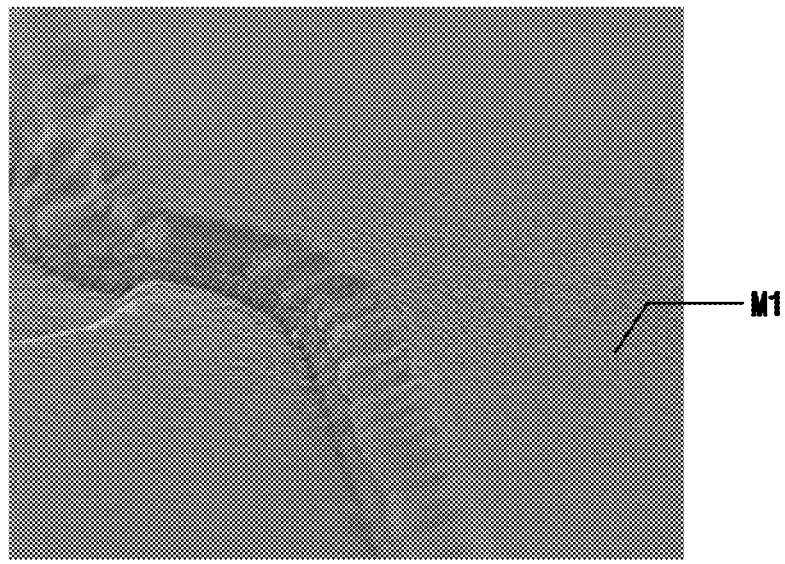
FIG. 12A is a cross-sectional view illustrating a copper metal layer provided with the composition for removing the photoresist according to Example 1.

A copper layer was formed on a substrate and was patterned to manufacture Metal Sample 6 including a copper metal pattern. Metal Samples 7 to 10 were manufactured via substantially the same method as manufacturing Metal Sample 6. In Metal Sample 6, an etched surface of the copper metal pattern was imaged using a scanning electrode microscope, and the SEM is illustrated in FIG. 12A.

EXPERIMENT 2

Evaluation of Corroding a Metal Layer

The composition for removing the photoresist according to Example 1 was provided to each of Metal Sample 1 and 6 for about 10 minutes. The composition for removing the photoresist according to Example 2 was provided to each of Metal Sample 2 and 7, and the composition for removing the photoresist according to Example 3 was provided to each of Metal Sample 3 and 8 for about 10 minutes.

In addition, the composition for removing the photoresist according to Comparative Example 1 was provided to each of Metal Samples 4 and 9, and the composition for removing the photoresist according to Comparative Example 2 was provided to each of Metal Samples 5 and 10 for about 10 minutes.

In each of Metal Samples 1 to 10, the corrosion of the aluminum pattern or the copper pattern was observable with the naked eye of a viewer. The obtained results are illustrated in Table 4. In Table 4, "○" represents when the aluminum pattern or the copper pattern was corroded, and "x" represents when the aluminum pattern or the copper pattern was not corroded.

TABLE 4

|  | Example 1 | Example 2 | Example 3 | Comparative Example 1 | Comparative Example 2 |
|---|---|---|---|---|---|
| Metal Sample 1 | x | — | — | — | — |
| Metal Sample 2 | — | x | — | — | — |
| Metal Sample 3 | — | — | x | — | — |
| Metal Sample 4 | — | — | — | ○ | — |
| Metal Sample 5 | — | — | — | — | ○ |
| Metal Sample 6 | x | — | — | — | — |
| Metal Sample 7 | — | x | — | — | — |
| Metal Sample 8 | — | — | x | — | — |
| Metal Sample 9 | — | — | — | ○ | — |
| Metal Sample 10 | — | — | — | — | ○ |

Referring to Table 4, each of the compositions for removing the photoresist according to Example 1 to 3 does not corrode both the aluminum pattern and the copper pattern. In contrast, each of the compositions for removing the photoresist according to Comparative Example 1 to 2 corrodes both the aluminum pattern and the copper pattern.

Figure 11A:
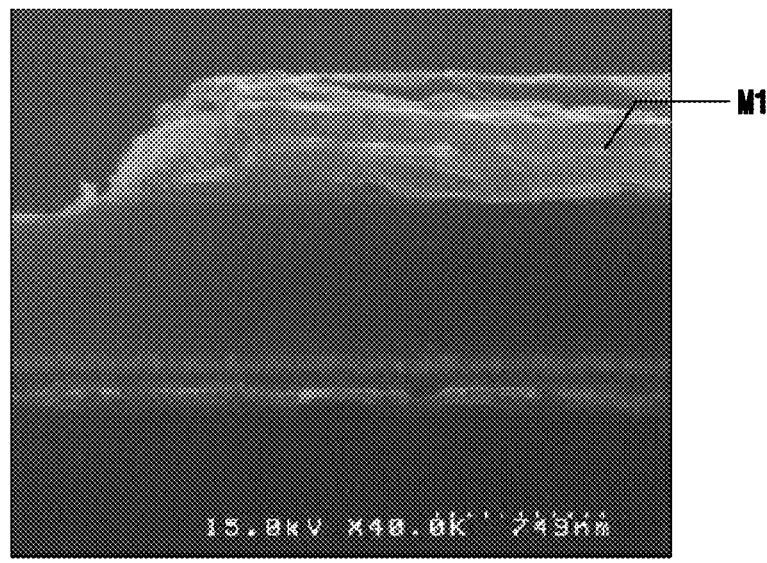
FIG. 11A is a cross-sectional view illustrating an aluminum metal layer provided with the composition for removing the photoresist according to Example 1.
Figure 11B:
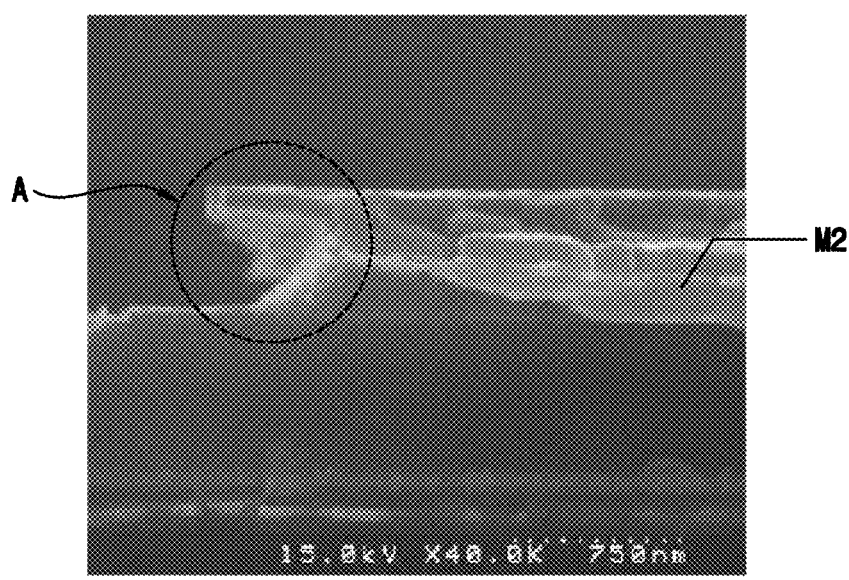
FIG. 11B is a cross-sectional view illustrating an aluminum metal layer provided with a composition for removing a photoresist according to Comparative Example 1.

FIG. 11A is a cross-sectional view illustrating an aluminum metal layer provided with the composition for removing the photoresist according to Example 1. FIG. 11B is a cross-sectional view illustrating an aluminum metal layer provided with the composition for removing the photoresist according to Comparative Example 1. In FIGS. 11A and 11B, an aluminum metal pattern M1 is indicated.

Referring to FIG. 11A, although the composition for removing the photoresist according to Example 1 is provided to the aluminum metal pattern, the aluminum metal pattern is not damaged. In contrast, referring to FIG. 11B, the composition for removing the photoresist according to Comparative Example 1 damages the aluminum metal pattern so that the etched surface "A" of the aluminum metal pattern is depressed.

Figure 12B:
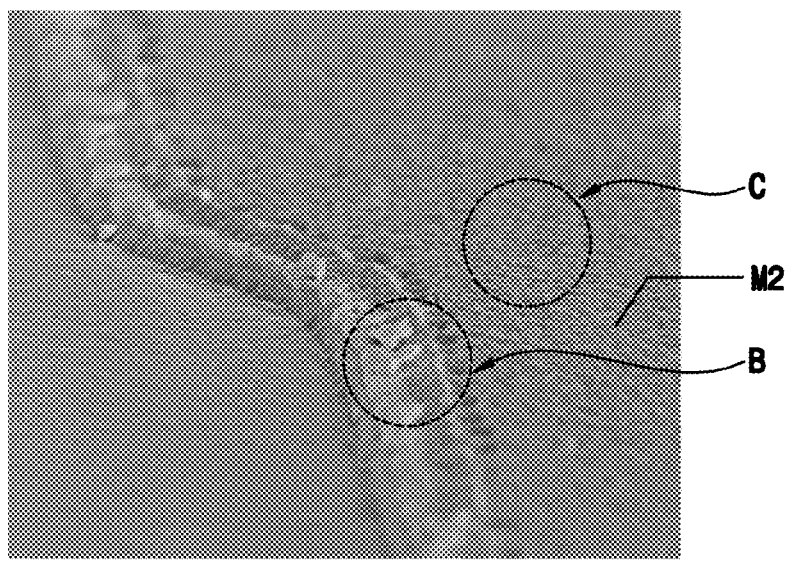
FIG. 12B is a cross-sectional view illustrating a copper metal layer provided with the composition for removing the photoresist according to Comparative Example 1.

FIG. 12A is a cross-sectional view illustrating a copper metal layer provided with the composition for removing the photoresist according to Example 1. FIG. 12B is a cross-sectional view illustrating a copper metal layer provided with the composition for removing the photoresist according to Comparative Example 1. In FIGS. 12A and 12B, a copper metal pattern M2 is indicated.

Referring to FIG. 12A, the composition for removing the photoresist according to Example 1 does not damage the copper metal pattern. In contrast, referring to FIG. 12B, the composition for removing the photoresist according to Comparative Example 1 damages the copper metal pattern so that the etched surface "B" of the copper metal pattern is depressed and a surface "C" of a metal layer in the copper metal pattern is corroded.

FIG. 13 is a table including SEMs illustrating a removed degree in accordance with a time by the composition for removing a photoresist according to Example 1.

Figure 13A:
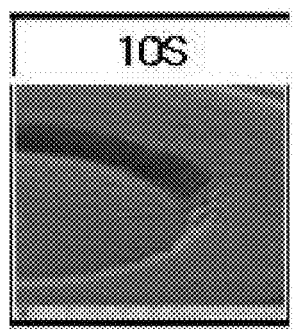
FIG. 13A to F are SEMs illustrating a removed degree of an organic layer over time by the composition for removing the photoresist according to Example 1.
Figure 13B:
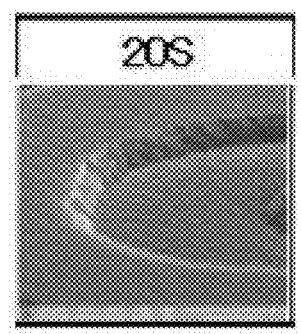
Figure 13C:
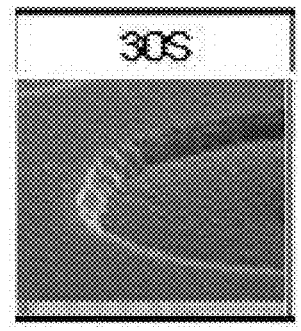
Figure 13D:
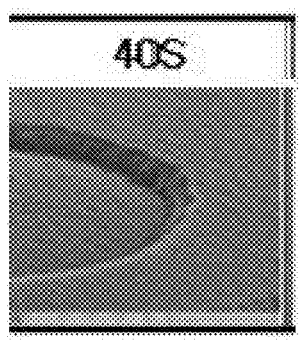
Figure 13E:
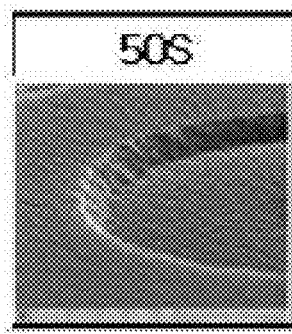
Figure 13F:
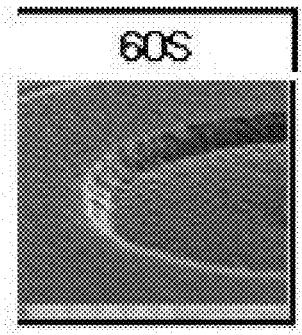

Referring to FIG. 13A to F, the organic layer is gradually removed over time. The images of FIG. 13A to F are taken at 10 second intervals. The organic layer is mostly removed after about 60 seconds, as shown in FIG. 13F.

According to the above descriptions, the corrosion of a lower metal layer disposed under an organic layer as a planarizing layer or a photoresist pattern as an etch-stopping layer may be reduced while improving a removing ability of the organic layer and the photoresist pattern. Thus, a reliability of a rework process of the organic layer may be improved, and a removing time of the organic layer and the photoresist pattern may be decreased.

In particular, when the organic layer or the photoresist pattern is formed using a positive photoresist composition or a negative photoresist composition, the organic layer and the photoresist pattern may be easily removed by the composition for removing a photoresist. Therefore, the rework process or the removing process of the photoresist pattern may be performed using a single stripping device, regardless of a type of the photoresist composition to improve a productivity of a TFT substrate.

The foregoing is illustrative of the present disclosure and is not to be construed as limiting thereof. Although a few example embodiments have been disclosed, those skilled in the art will readily appreciate that many modifications are possible in the example embodiments without materially departing from the novel teachings and advantages disclosed herein. Accordingly, all such modifications are intended to be included within the scope of the present disclosure. In the claims, means-plus-function clauses are intended to cover the structures described herein as performing the recited function, structural equivalents, and equivalent structures. Therefore, it is to be understood that the foregoing is illustrative and is not to be construed as limited to the specific example embodiments disclosed, and that modifications to the disclosed example embodiments, as well as other example embodiments, are intended to be included within the scope of the appended claims.

What is claimed is:

1. A composition for removing a photoresist, the composition comprising:
    about 1% by weight to about 10% by weight of tetramethyl ammonium hydroxide;
    about 1% by weight to about 10% by weight of an alkanol amine;
    about 50% by weight to about 70% by weight of a glycol ether compound;
    about 0.01% by weight to about 1% by weight of a triazole compound;
    about 20% by weight to about 40% by weight of a polar solvent; and
    water, each based on a total weight of the composition.

2. The composition of claim 1, wherein the glycol ether compound comprises dimethylene glycol monomethyl ether.

3. The composition of claim 1, wherein the polar solvent comprises N-methyl-2-pyrrolidone.

4. The composition of claim 1, wherein the composition consists of the tetramethyl ammonium hydroxide, the alkanol amine, the glycol ether compound, the triazole compound, the polar solvent, and water.

5. A composition for removing a photoresist, the composition comprising:
    about 1% by weight to about 5% by weight of tetramethyl ammonium hydroxide;
    about 1% by weight to about 5% by weight of an alkanol amine;
    about 55% by weight to about 65% by weight of dimethylene glycol monomethyl ether;
    about 20% by weight to about 40% by weight of N-methyl-2-pyrrolidone;
    about 0.01% by weight to about 1% by weight of a triazole compound; and
    water, each based on a total weight of the composition.

6. A method of manufacturing a thin-film transistor substrate, the method comprising:
    providing a thin-film transistor on a base substrate;
    forming a first organic layer by disposing a photosensitive organic composition on the base substrate on which the thin-film transistor is disposed;
    removing at least a portion of the first organic layer by contacting the first organic layer with a composition for removing an organic pattern, the composition comprising
        about 1% by weight to about 10% by weight of tetramethyl ammonium hydroxide,
        about 1% by weight to about 10% by weight of an alkanol amine,
        about 50% by weight to about 70% by weight of a glycol ether compound,
        about 0.01% by weight to about 1% by weight of a triazole compound,
        about 20% by weight to about 40% by weight of a polar solvent, and
        water, each based on a total weight of the composition;
    forming a second organic layer on the base substrate from which the first organic layer is removed; and
    forming a pixel electrode on the second organic layer, wherein the pixel electrode is electrically connected to the thin-film transistor, to manufacture the thin-film transistor substrate.

7. The method of claim 6, wherein the glycol ether compound is dimethylene glycol monomethyl ether,
    the triazole compound is tolytriazole and
    the polar solvent is N-methyl-2-pyrrolidone.

8. The method of claim 6, wherein the composition for removing the organic pattern comprises:
    about 1% by weight to about 5% by weight of tetramethyl ammonium hydroxide,
    about 1% by weight to about 5% by weight of the alkanol amine,
    about 55% by weight to about 65% by weight of dimethylene glycol monomethyl ether,
    about 20% by weight to about 40% by weight of N-methyl-2-pyrrolidone,
    about 0.01% by weight to about 1% by weight of the triazole compound, and
    water, each based on a total weight of the composition.

9. The method of claim 6, wherein the photosensitive organic composition is a negative photoresist and a portion of the organic pattern, which is not exposed to a light, is soluble in a developing solution.

10. The method of claim 6, wherein the photosensitive organic composition is a positive photoresist and a portion of the organic pattern, which is exposed to a light, is soluble in a developing solution.

11. The method of claim 6, further comprising forming an inorganic layer on the base substrate on which the thin-film transistor is formed before the forming of the first organic layer,
    wherein the inorganic layer and the first organic layer each includes a contact hole which exposes an output electrode of the thin-film transistor.

12. The method of claim 6, wherein the providing the thin-film transistor comprises:

forming a metal layer including aluminum or copper on the base substrate; and forming an input electrode connected to a data line and an output electrode spaced apart from the input electrode by patterning the metal layer.

13. The method of claim 12, wherein the forming the input electrode comprises:

forming a photoresist pattern on the metal layer;

etching the metal layer using the photoresist pattern; and removing at least a portion of the photoresist pattern using a composition for removing a photoresist, wherein the composition for removing a photoresist comprises the composition for removing the organic pattern.

14. The method of claim 13, wherein the photoresist pattern is formed using a negative photoresist composition wherein a portion of the organic pattern, which is not exposed to a light, is soluble in a developing solution.

15. The method of claim 13, wherein the photoresist pattern is formed using a positive photoresist composition wherein a portion of the organic pattern, which is exposed to a light, is soluble in the developing solution.

16. The method of claim 13, wherein the removing at least a portion of the first organic layer comprises removing an entirety of the first organic layer.

17. A method of manufacturing a thin-film transistor substrate, the method comprising:

forming a metal layer on a base substrate;

forming a photoresist pattern on the metal layer;

patterning the metal layer using the photoresist pattern as an etch-stopping layer to form a first signal line and a first electrode of a thin-film transistor connected to the first signal line;

removing at least a portion of the photoresist pattern by contacting the photoresist pattern with a composition for removing a photoresist, the composition comprising
about 1% by weight to about 10% by weight of tetramethyl ammonium hydroxide,
about 1% by weight to about 10% by weight of an alkanol amine,
about 50% by weight to about 70% by weight of dimethylene glycol monomethyl ether,
about 20% by weight to about 40% by weight of N-methyl-2-pyrrolidone,
about 0.01% by weight to about 1% by weight of a triazole compound, and
water, each based on a total weight of the composition; and forming a pixel electrode electrically connected to the thin-film transistor to manufacture the thin-film transistor substrate.

18. The method of claim 17, wherein the composition for removing the photoresist comprises:
about 1% by weight to about 5% by weight of tetramethyl ammonium hydroxide,
about 1% by weight to about 5% by weight of the alkanol amine,
about 55% by weight to about 65% by weight of dimethylene glycol monomethyl ether,
about 20% by weight to about 40% by weight of N-methyl-2-pyrrolidone,
about 0.01% by weight to about 1% by weight of the triazole compound, and
water, each based on a total weight of the composition.

19. The method of claim 18, wherein the photoresist pattern is formed using a negative photoresist composition wherein a portion of the photoresist pattern, which is not exposed to a light, is soluble in a developing solution.

20. The method of claim 18, wherein the photoresist pattern is formed using a positive photoresist composition wherein a portion of the photoresist pattern, which is exposed to a light, is soluble in a developing solution.

21. The method of claim 18, wherein the metal layer comprises aluminum or copper.

22. The method of claim 18, wherein the first signal line is a gate line and the first electrode is a gate electrode, and further comprising forming a second signal line crossing the first signal line, a second electrode connected to the second signal line, and a third electrode spaced apart from the second electrode before forming the pixel electrode.

23. The method of claim 18, wherein the first signal line is a data line, the first electrode is an input electrode, and a second electrode is formed in the patterning of the metal layer to form the first signal line and the first electrode, further comprising forming a second signal line crossing the first signal line and a third electrode as a control electrode connected to the second signal line before the forming of the pixel electrode.

24. The method of claim 18, wherein the removing at least a portion of the photoresist pattern comprises removing an entirety of the photoresist pattern.

* * * * *